(12) United States Patent
Lee

(10) Patent No.: US 10,314,214 B2
(45) Date of Patent: Jun. 4, 2019

(54) VAPOR CHAMBER WITH ELECTROMAGNETIC SHIELDING FUNCTION

(71) Applicant: GETAC TECHNOLOGY CORPORATION, Hsinchu County (TW)

(72) Inventor: Ping-Wei Lee, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 1 day.

(21) Appl. No.: 15/782,713

(22) Filed: Oct. 12, 2017

(65) Prior Publication Data
US 2019/0116698 A1 Apr. 18, 2019

(51) Int. Cl.
| | | |
|---|---|---|
| H05K 9/00 | (2006.01) | |
| H05K 7/20 | (2006.01) | |
| F28D 15/04 | (2006.01) | |
| F28D 15/02 | (2006.01) | |

(52) U.S. Cl.
CPC ....... H05K 9/0081 (2013.01); H05K 7/20445 (2013.01); H05K 9/0032 (2013.01); H05K 9/0039 (2013.01); *F28D 15/0266* (2013.01); *F28D 15/046* (2013.01); *H01L 2924/3025* (2013.01)

(58) Field of Classification Search
CPC ............. H05K 9/0081; H05K 7/20445; H05K 9/0039; H05K 9/0032; H05K 7/20336; H05K 7/20–2099; F28D 15/0266; F28D 15/046; H01L 2924/3025; H01L 23/34–4735; H01L 23/552–556; H01L 23/60; G06F 1/206; G06F 1/20–206
USPC .............. 174/15.1–15.2, 16.1–16.3, 32–397; 257/659–660, 706–722
See application file for complete search history.

(56) References Cited

U.S. PATENT DOCUMENTS

| | | | | |
|---|---|---|---|---|
| 2002/0100968 A1* | 8/2002 | Zuo | ........................ | H01L 23/427 257/715 |
| 2003/0147204 A1* | 8/2003 | Koike | ................... | H05K 5/0043 361/600 |
| 2005/0219831 A1* | 10/2005 | Vinokor | ............... | H05K 9/0032 361/797 |
| 2009/0021529 A1* | 1/2009 | Wendler | ..................... | G09F 9/33 345/619 |

(Continued)

OTHER PUBLICATIONS

STIC search report (Year: 2018).*

*Primary Examiner* — Steven T Sawyer
*Assistant Examiner* — Sagar Shrestha

(57) ABSTRACT

A vapor chamber with electromagnetic shielding function is for dissipating the heat generated by an electronic component. The vapor chamber includes a capillary structure, a support structure, and a working fluid. The vapor chamber includes an extension portion and a frame, and the extension portion extends from the main body of the vapor chamber and has a first coupling structure. The frame has side walls to surround the electronic component in a plane, and a second coupling structure is disposed on each of the side walls. The first coupling structure is engaged with the second coupling structure, so that the vapor chamber detachably covers the electronic component to perform the electromagnetic shielding function.

17 Claims, 6 Drawing Sheets

(56) References Cited

U.S. PATENT DOCUMENTS

| | | | |
|---|---|---|---|
| 2013/0271933 A1* | 10/2013 | Tanaka | H05K 5/0052 |
| | | | 361/752 |
| 2016/0135336 A1* | 5/2016 | Wu | H05K 9/0049 |
| | | | 361/714 |
| 2017/0110411 A1* | 4/2017 | Meyer, IV | H01L 23/552 |
| 2017/0122671 A1* | 5/2017 | Lin | F28D 15/0275 |
| 2017/0163302 A1* | 6/2017 | Saeidi | H04B 1/036 |
| 2017/0238442 A1* | 8/2017 | Zhang | H05K 7/20336 |
| | | | 455/550.1 |
| 2018/0066898 A1* | 3/2018 | Lin | H05K 7/20336 |
| 2018/0120912 A1* | 5/2018 | Jenkins | B33Y 70/00 |

* cited by examiner

VAPOR CHAMBER WITH ELECTROMAGNETIC SHIELDING FUNCTION

BACKGROUND OF THE INVENTION

Field of the Invention

The present invention relates to vapor chambers and, more particularly, to a vapor chamber with an electromagnetic shielding function.

Description of the Prior Art

Commercially-available, general-purpose computers, smart mobile devices and the other electronic devices each comprise therein electronic components. Heat is generated whenever the electronic devices operate. The heat accumulates inside the electronic devices and hardly dissipates. As a result, performance of the electronic components deteriorates over time. To overcome the aforesaid drawback, the prior art discloses mounting a vapor chamber inside an electronic device but incurs high manufacturing costs in meeting requirements, such as a hermetic seal and heat transfer.

The electronic components in operation also produce an electromagnetic field. The electromagnetic fields of the electronic components interfere with each other to the detriment of the operation of the electronic devices, that is, electromagnetic interference (EMI). A conventional way of preventing electromagnetic interference involves enclosing the electronic components with an appropriate electromagnetic mask to block electromagnetic waves. The electromagnetic mask, usually made of a metal, is manufactured by mass production and processed by automated assembly, using sheet metal. Therefore, the electromagnetic mask is popular with the industrial sector because of the mature technology required and the low costs incurred.

In view of this, it is important that a conventional manufacturing process provides a vapor chamber or a housing to effectuate heat dissipation and electromagnetic shielding, respectively, features simple manufacturing and assembly procedures, and enables reduction of manufacturing and maintenance costs.

SUMMARY OF THE INVENTION

In view of the aforesaid drawbacks of the prior art, it is an objective of the present invention to provide a vapor chamber with an electromagnetic shielding function such that the vapor chamber is effective in dissipating heat generated from electronic components and equipped with a capillary structure, a supporting structure, and a working fluid. The vapor chamber further comprises an extending portion and a shielding frame. The extending portion extends from the vapor chamber and has a first coupling structure. The shielding frame has a sidewall for surrounding the electronic components on a plane, and a second coupling structure disposed on the sidewall, with the second coupling structure engaged with the first coupling structure, thereby allowing the vapor chamber to demountably cover the electronic component and thus perform the electromagnetic shielding function.

Regarding the vapor chamber, in an embodiment, the vapor chamber further comprises a covering plate and a co-constructed plate. The covering plate has the extending portion. The co-constructed plate and the covering plate jointly define a room for containing the capillary structure, the supporting structure, and the working fluid.

Regarding the vapor chamber, in an embodiment, the vapor chamber further comprises a covering plate and a co-constructed plate. The co-constructed plate has the extending portion and defines, jointly with the covering plate, a room for containing the capillary structure, the supporting structure, and the working fluid.

Regarding the vapor chamber, in an embodiment, the covering plate covers the co-constructed plate by receiving it, with the co-constructed plate disposed between the shielding frame and the covering plate.

Regarding the vapor chamber, in an embodiment, the covering plate and the co-constructed plate are made of the same material.

Regarding the vapor chamber, in an embodiment, the first coupling structure is integrally formed on an inner surface of the extending portion, and the second coupling structure is integrally formed on an outer surface of the sidewall.

Regarding the vapor chamber, in an embodiment, the shielding frame has a fetch region, and the fetch region extends vertically from the sidewall.

Regarding the vapor chamber, in an embodiment, an inner surface of the covering plate and an outer surface of the co-constructed plate are fixed to each other by a soldering layer.

Regarding the vapor chamber, in an embodiment, one of the first coupling structure and the second coupling structure is a concave rail, and the other is a convex structure which matches the concave rail.

Regarding the vapor chamber, in an embodiment, one of the first coupling structure and the second coupling structure is a hook, and the other is a slot or hole which matches the hook.

In the aforesaid embodiments of the present invention, the vapor chamber effectuates heat dissipation and prevention of electromagnetic interference. The vapor chamber is easy to mount for assembly-related purposes. From a manufacturing perspective, the vapor chamber incurs low manufacturing costs because of its simplified manufacturing process. Therefore, the vapor chamber effectively solves the aforesaid problems which the prior art confronts.

The features and advantages of the present invention are detailed hereinafter with reference to the preferred embodiments. The detailed description is intended to enable persons skilled in the art to gain insight into the technical contents disclosed herein and implement the present invention accordingly. In particular, persons skilled in the art can easily understand the objects and advantages of the present invention by referring to the disclosure of the specification, the claims, and the accompanying drawings.

DETAILED DESCRIPTION OF THE EMBODIMENTS

The technical solutions proposed herein to achieve the objectives of the present invention are further described below with reference to accompanying drawings and preferred embodiments of the present invention. Persons skilled in the art understand that directional wording, including "on," "downward" and "front," used in describing the preferred embodiments of the present invention is illustrative of directions in the accompanying drawings rather than restrictive of the present invention. Moreover, persons skilled in the art may make numerous variations and changes in the preferred embodiments of the present invention without departing from the spirit and scope of the present invention, and the resultant preferred embodiments of the present invention must be deemed falling within the scope of the present invention.

Figure 1:
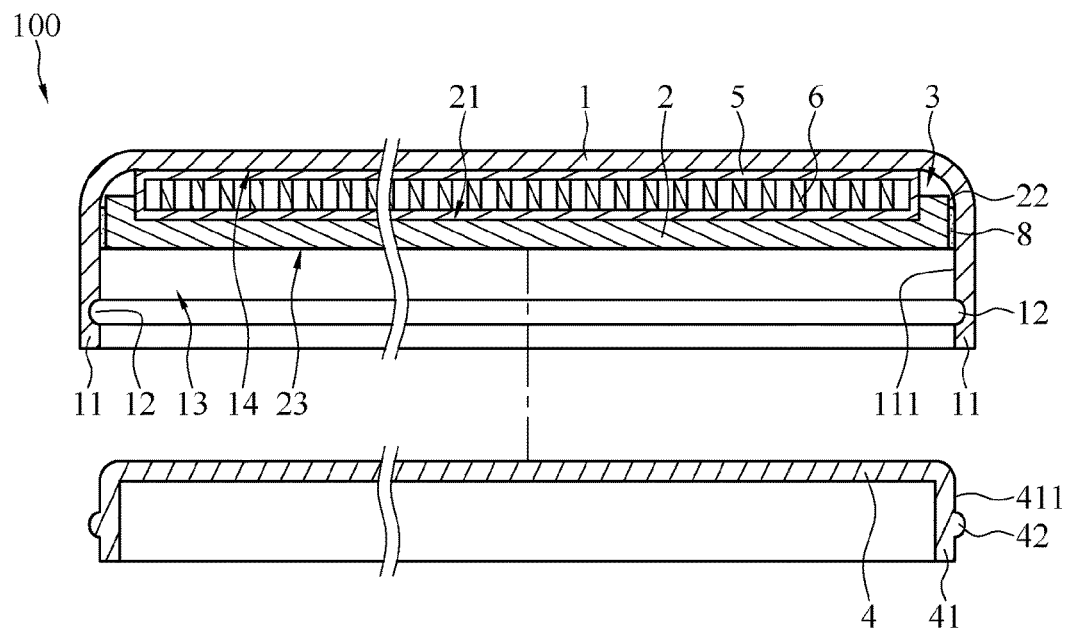
FIG. 1 is an exploded cross-sectional view of a vapor chamber according to the first embodiment of the present invention.
Figure 2:
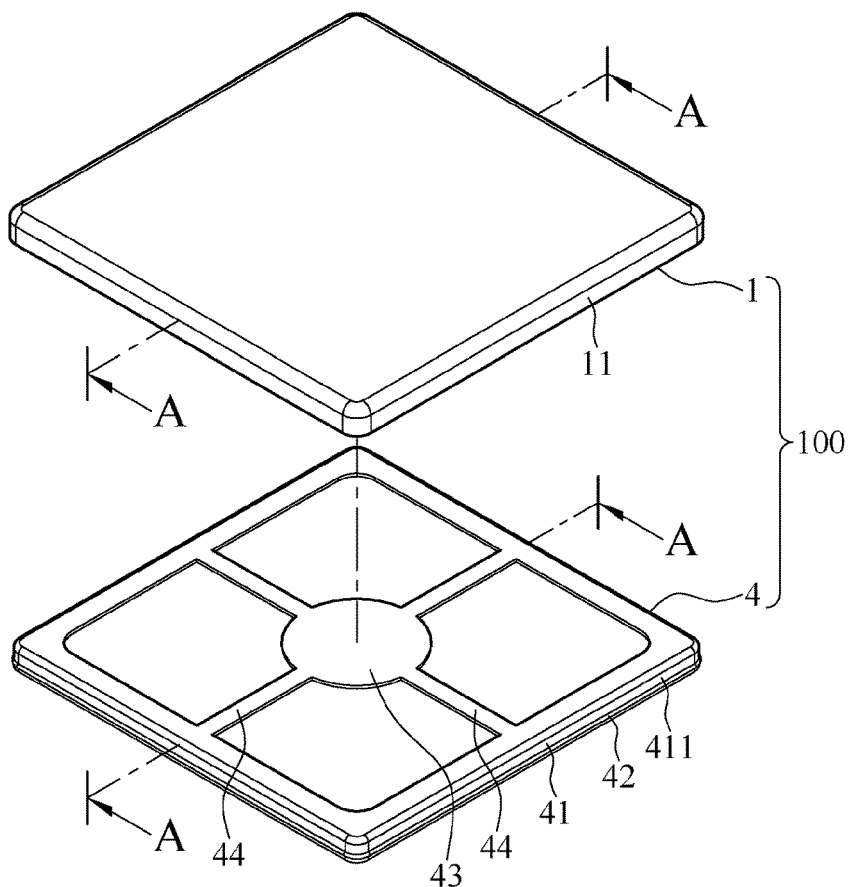
FIG. 2 is a perspective exploded view of the vapor chamber according to the first embodiment of the present invention.

Referring to FIG. 1 and FIG. 2, there are shown in FIG. 1 an exploded cross-sectional view of a vapor chamber 100 taken along the cutting line A-A of FIG. 2 according to the first embodiment of the present invention, and in FIG. 2 a perspective exploded view of the vapor chamber 100 according to the first embodiment of the present invention. The vapor chamber 100 dissipates heat generated from electronic components in operation and has a capillary structure 5, a supporting structure 6 and a working fluid (not shown). The vapor chamber 100 further comprises an extending portion 11 and a shielding frame 4. The extending portion 11 extends from the outer wall of the vapor chamber 100. The extending portion 11 has a first coupling structure 12. In an embodiment, the extending portion 11 extends from the inside of the vapor chamber 100 (see the description of the third embodiment). The shielding frame 4 has a sidewall 41. The shielding frame 4 surrounds an electronic component 71 (see FIG. 3) on a plane (for example, on a circuit board 7). The shielding frame 4 comprises a second coupling structure 42 disposed on the sidewall 41. The second coupling structure 42 is engaged with the first coupling structure 12 so that the vapor chamber 100 covers the electronic component 71 in a demountable and mountable manner, thereby performing the electromagnetic shielding function.

Referring to FIG. 1 and FIG. 2, the vapor chamber 100 has a covering plate 1 and a co-constructed plate 2. A soldering layer 8 is disposed between an inner surface 111 of the covering plate 1 and an outer surface 22 of the co-constructed plate 2. The covering plate 1 and the co-constructed plate 2 are fixed in place and engaged with each other because of the soldering layer 8, thereby preventing the separation of the covering plate 1 and the co-constructed plate 2. The co-constructed plate 2 has a substantially inverted, n-shaped cross section and comprises an opening 21. The covering plate 1 has a substantially n-shaped cross section. The covering plate 1 has an opening 13 larger than the co-constructed plate 2; hence, the co-constructed plate 2 can be received in the covering plate 1 and disposed between the shielding frame 4 and the covering plate 1 (during an assembly process). The opening 21 of the co-constructed plate 2 faces a bottom surface 14 of the covering plate 1; hence, a room 3 is formed between the covering plate 1 and the co-constructed plate 2. The capillary structure 5 is disposed on the inner wall of the room 3 and is tubular. The supporting structure 6 is disposed inside the capillary structure 5 but spaced apart therefrom, so as to be fitted between the covering plate 1 and the co-constructed plate 2. The supporting structure 6 is, for example, provided in the form of posts and powder and made of copper. In this embodiment, the supporting structure 6 is indirectly fitted between the covering plate 1 and the co-constructed plate 2. In some embodiments, the supporting structure 6 is directly fitted between the covering plate 1 and the co-constructed plate 2, depending on the way in which the capillary structure 5 is provided. As shown in the cross-sectional view of FIG. 1, the extending portion 11 is disposed on the covering plate 1, whereas the extending portion 11 extends downward from the room 3 and thus protrudes from a top surface 23 of the co-constructed plate 2 by a lengthwise distance. The first coupling structure 12 is disposed on the extending portion 11. In some embodiments, the first coupling structure 12 adjoins an extending end of the extending portion 11, but the present invention is not limited thereto. The first coupling structure 12 is a snap-engagement structure; in the first embodiment, the first coupling structure 12 is a concave rail, whereas the second coupling structure 42 of the shielding frame 4 is a convex structure which matches the concave rail. The opening 13 formed at the extending portion 11 of the covering plate 1 is large enough to receive the shielding frame 4; hence, the second coupling structure 42 are coupled to or engaged with the first coupling structure 12. Therefore, the vapor chamber 100 can not only cover the shielding frame 4 but can also be mounted thereon. Furthermore, the vapor chamber 100 can be repeatedly demounted and thus separated from the shielding frame 4.

In some embodiments, the first coupling structure 12 is integrally formed on the inner surface 111 of the extending portion 11, whereas the second coupling structure 42 is integrally formed on an outer surface 411 of the sidewall 41; hence, the first coupling structure 12 and the second coupling structure 42 are separate components which can be mountably integrated with the extending portion 11 and the sidewall 41, respectively, but the present invention is not limited thereto. In some embodiments, the first coupling structure 12 can not only be formed annularly on the inner surface 111 of the extending portion 11 but can also be formed discretely and segmentally on the inner surface 111 of the extending portion 11. To match the first coupling structure 12, the second coupling structure 42 is also formed, either annularly, or discretely and segmentally, on the outer surface 411 of the sidewall 41 so that the second coupling structure 42 and the first coupling structure 12 match and are coupled together.

Figure 3:
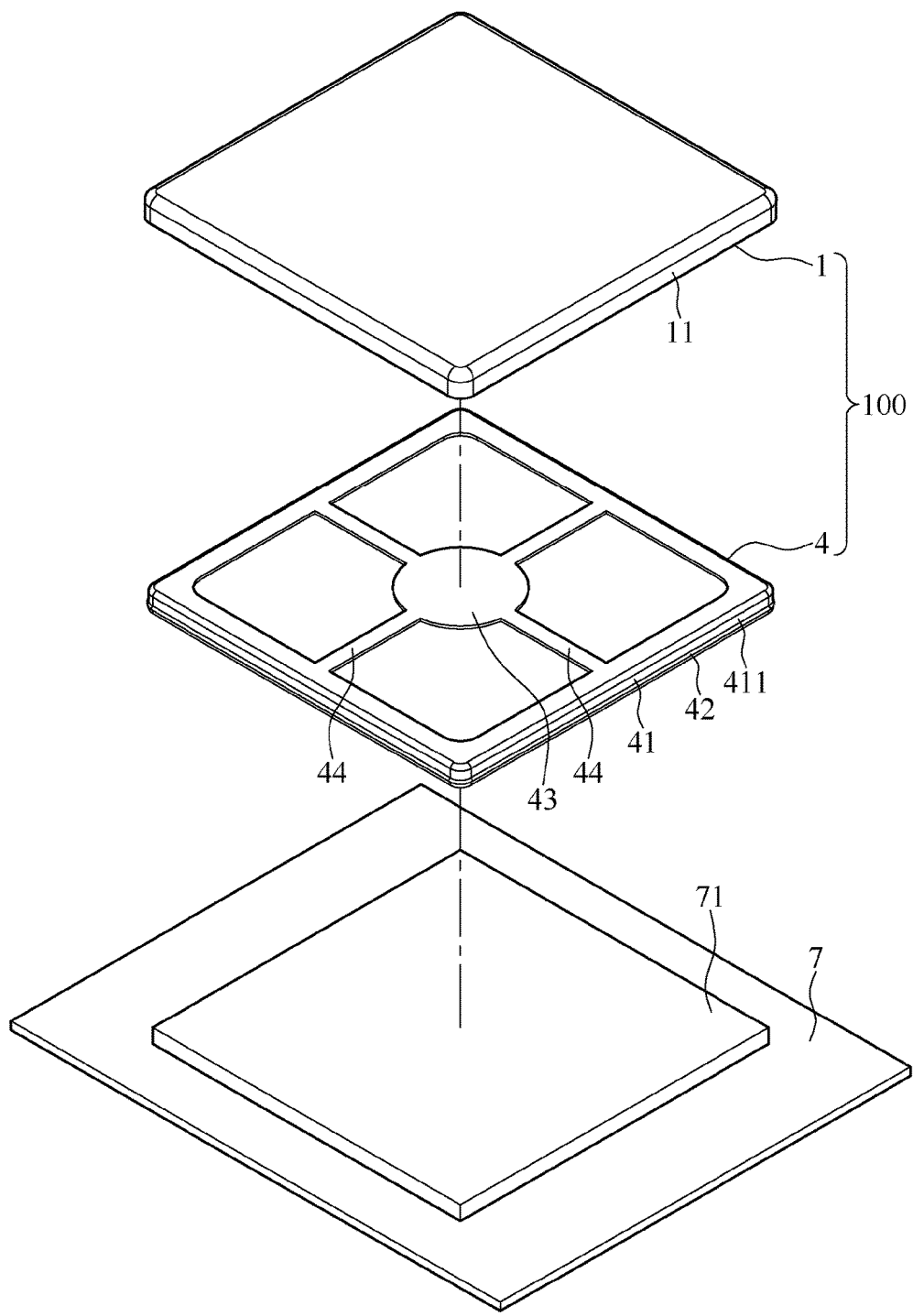
FIG. 3 is a schematic view of operation of the vapor chamber according to the first embodiment of the present invention.
Figure 4:
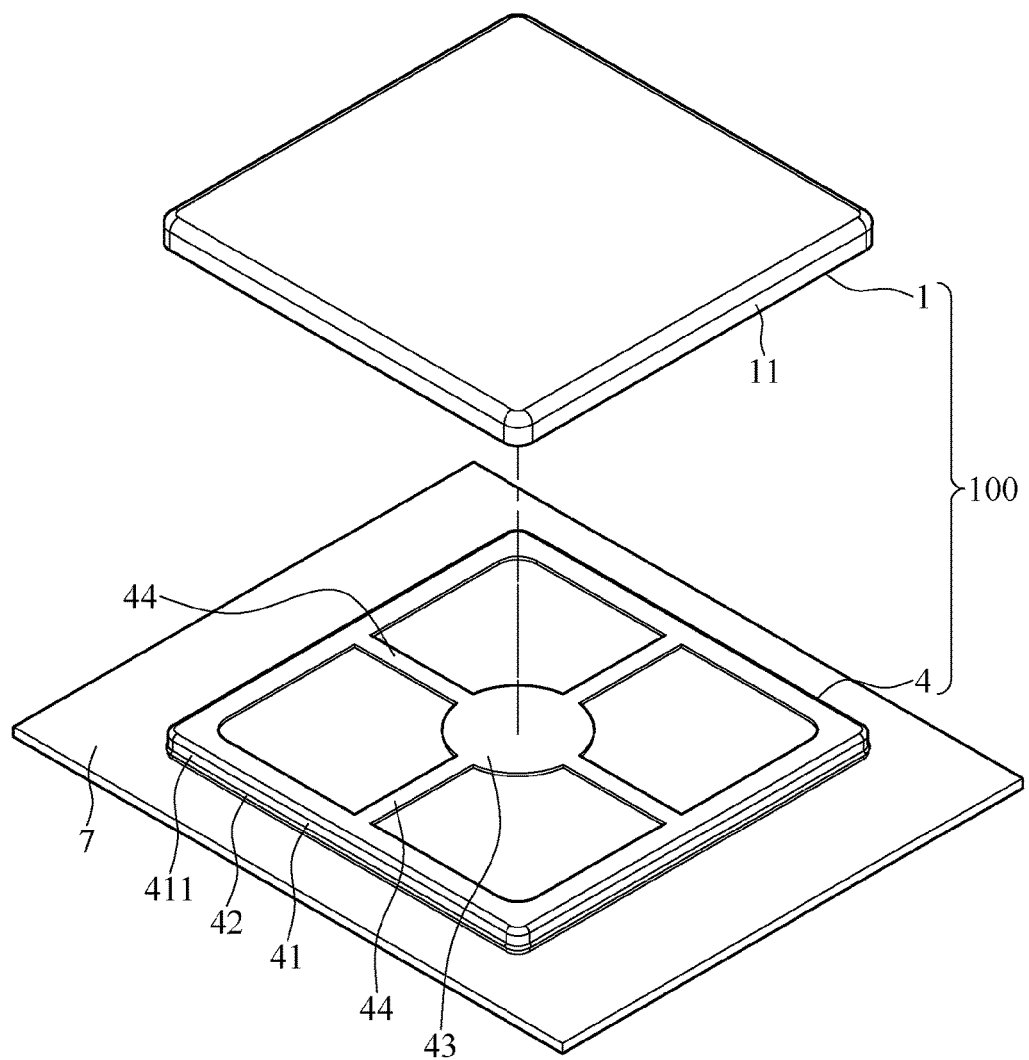
FIG. 4 is a schematic view of operation of the vapor chamber according to the first embodiment of the present invention.
Figure 5:
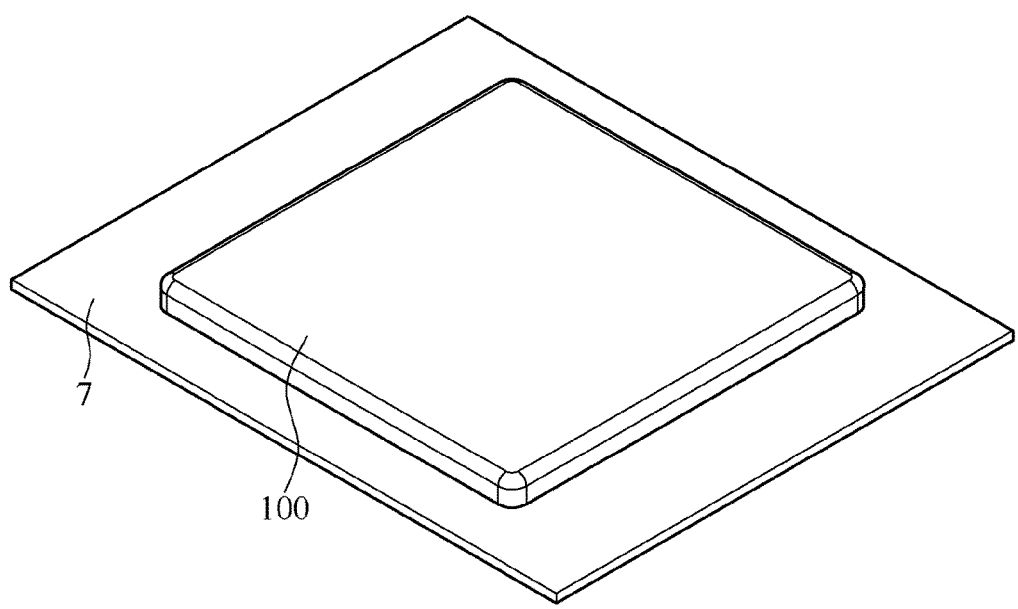
FIG. 5 is a schematic view of operation of the vapor chamber according to the first embodiment of the present invention.

Referring to FIG. 3 through FIG. 5, there are shown schematic views of operation of the vapor chamber 100 according to the first embodiment of the present invention. The shielding frame 4 is fixedly disposed on the circuit board 7 to surround the electronic component 71 disposed on the circuit board 7. In the first embodiment, the shielding frame 4 has a fetch region 43 defined centrally thereon. The periphery of the fetch region 43 connects with arms 44. The arms 44 extend vertically from the sidewall 41 to connect with the fetch region 43. In this embodiment, the fetch region 43 is round, but the present invention is not limited thereto. In some embodiments, the fetch region 43 is square. A sucker at the front end of a robotic arm adheres to the fetch region 43 of the shielding frame 4, thereby aligning the shielding frame 4 with the edges of the electronic component 71 automatically and precisely, as shown in FIG. 4. After fixing the shielding frame 4 to the edges of the electronic component 71, the robotic arm covers the shielding frame 4 with the covering plate 1 so that the covering plate 1 and the shielding frame 4 are coupled together by the concave rail of the first coupling structure 12 and the convex structure of the second coupling structure 42. The co-constructed plate 2 is disposed between the shielding frame 4 and the covering plate 1. The vapor chamber 100 has therein the capillary structure 5, the supporting structure 6 and a working fluid and thereby effectuates heat dissipation and uniform distribution of temperature. The covering plate 1 functions as a mask for eliminating electromagnetic interference. Therefore, the vapor chamber 100 effectuates heat dissipation and electromagnetic shielding.

Figure 6:
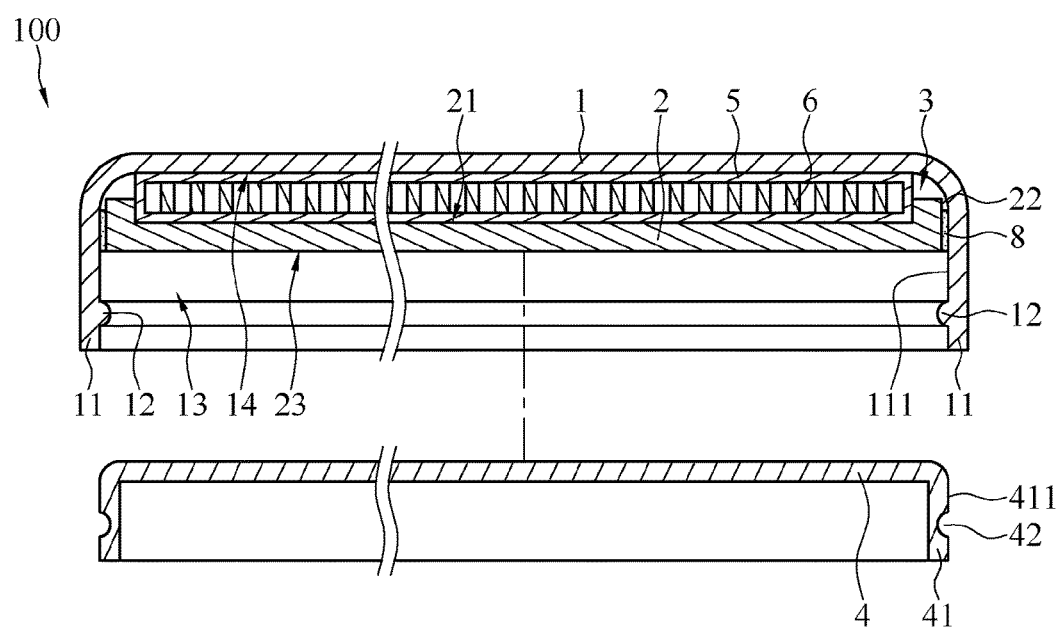
FIG. 6 is an exploded cross-sectional view of the vapor chamber according to the second embodiment of the present invention.

Referring to FIG. 6, there is shown an exploded cross-sectional view of the vapor chamber 100 according to the second embodiment of the present invention. The second embodiment is distinguished from the first embodiment as follows: in the second embodiment, the first coupling structure 12 is a convex structure, whereas the second coupling structure 42 of the shielding frame 4 is a concave rail which matches the convex structure. Therefore, the covering plate 1 and the shielding frame 4 can be advantageously, freely demounted and mounted.

Figure 7:
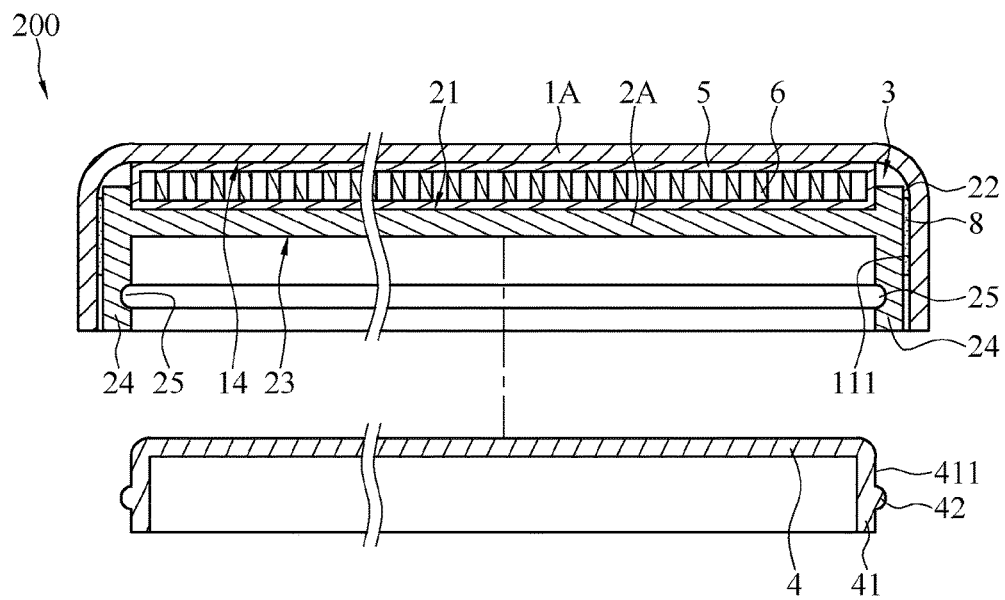
FIG. 7 is an exploded cross-sectional view of a vapor chamber according to the third embodiment of the present invention.

Referring to FIG. 7, there is shown an exploded cross-sectional view of a vapor chamber 200 according to the third embodiment of the present invention. The third embodiment is distinguished from the first and second embodiments by technical features described below. In the third embodiment, an extending portion 24 is disposed on the co-constructed plate 2. The extending portion 24 extends from the top surface 23 of a co-constructed plate 2A and has a first coupling structure 25. A covering plate 1A looks like a cap and receives the co-constructed plate 2A. The soldering layer 8 is disposed between the inner surface 111 of the covering plate 1A and the outer surface 22 of the co-constructed plate 2A to prevent separation of the covering plate 1A and the co-constructed plate 2A. In the third embodiment, the first coupling structure 25 is a concave rail, whereas the second coupling structure 42 of the shielding frame 4 is a convex structure which matches the concave rail. In some embodiments, the first coupling structure 25 is formed, either annularly, or discretely and segmentally, on an inner surface of the extending portion 24. The second coupling structure 42 of the shielding frame 4 corresponds in shape to the first coupling structure 25 in such a manner that the second coupling structure 42 and the first coupling structure 25 can be coupled together, thereby allowing the co-constructed plate 2A and the shielding frame 4 to be freely demounted and mounted.

Figure 8:
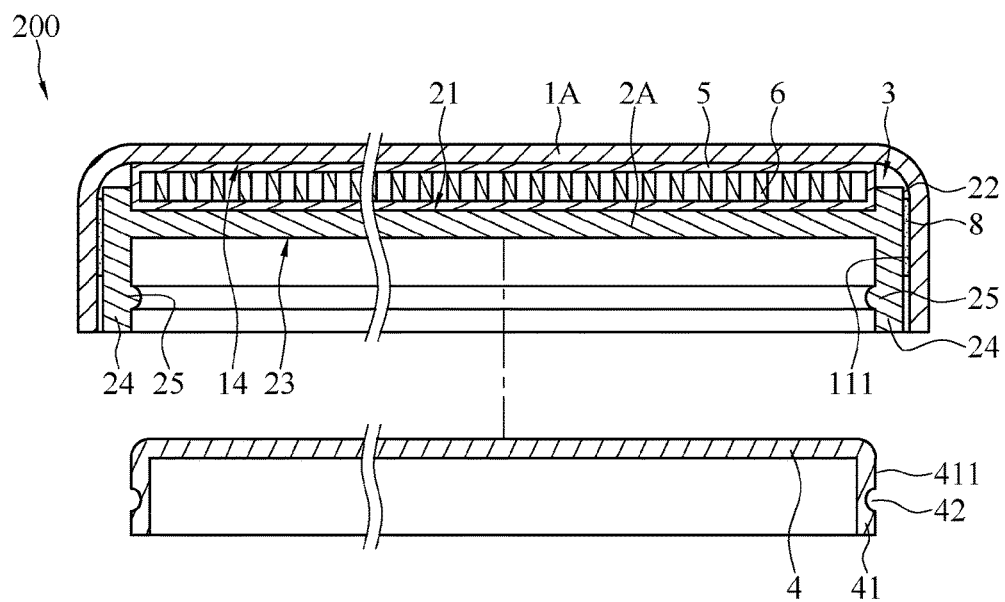
FIG. 8 is an exploded cross-sectional view of the vapor chamber according to the fourth embodiment of the present invention.

Referring to FIG. 8, there is shown an exploded cross-sectional view of the vapor chamber 200 according to the fourth embodiment of the present invention. The fourth embodiment is distinguished from the third embodiment in that in the fourth embodiment the first coupling structure 25 is a convex structure which protrudes toward the inside of the co-constructed plate 2A, whereas the second coupling structure 42 of the shielding frame 4 is a concave rail which matches the convex structure. For the way of putting together and the way of separating the co-constructed plate 2A and the shielding frame 4, refer to the above description.

The present invention is not restrictive of the shape of the first and second coupling structures. In some embodiments, the first coupling structure 12 (25) is a hook, whereas the second coupling structure 42 is a slot or hole which matches the hook, and vice versa.

In some embodiments, the covering plate 1 and the co-constructed plate 2 are made of the same material, such as the same metal, preferably a copper alloy or an aluminum-magnesium alloy, but the present invention is not limited thereto.

In the aforesaid embodiments of the present invention, the vapor chamber has therein a capillary structure, a supporting structure and a working fluid. The working fluid in the capillary structure continually alternates between evaporation and condensation to transfer and dissipate heat quickly and thus effectuate uniform distribution of temperature and dissipation of heat.

In the aforesaid embodiments of the present invention, the vapor chamber further has the shielding frame, the covering plate and the co-constructed plate. The extending portion is selectively disposed on the covering plate or the co-constructed plate as needed. The extending portion has the first coupling structure which can be coupled to the second coupling structure of the shielding frame to mask an internal electronic component, so as to block external electromagnetic waves and eliminate electromagnetic interference.

In the aforesaid embodiments of the present invention, the vapor chamber effectuates dissipation of heat, uniform distribution of temperature, and electromagnetic shielding. The vapor chamber is easy to mount for assembly-related and use-related purposes. From a manufacturing perspective, the vapor chamber incurs low manufacturing costs because of its simplified manufacturing process.

Although the present invention is disclosed above by preferred embodiments, the preferred embodiments are not restrictive of the present invention. Changes and modifications made by persons skilled in the art to the preferred embodiments without departing from the spirit of the present invention must be deemed falling within the scope of the present invention. Accordingly, the legal protection for the present invention should be defined by the appended claims.

What is claimed is:

1. A cover of a vapor chamber with an electromagnetic shielding function, the vapor chamber including a shielding frame having a second coupling structure, the cover adapted to demountably engage with the shielding frame and to dissipate heat from an electronic component surrounded by the shielding frame, the cover comprising:
    a covering plate disposed over the shielding frame and having an extending portion, wherein the extending portion surrounds the shielding frame, the extending portion comprises a first coupling structure disposed on an inner surface thereof, and the second coupling structure demountably engages with the first coupling structure; and
    a co-constructed plate disposed between the covering plate and the shielding frame, wherein the co-constructed plate and the covering plate jointly define a room containing a capillary structure, a supporting structure, and a working fluid, and wherein the co-constructed plate is nested within a space defined by the covering plate.

2. A cover of a vapor chamber with an electromagnetic shielding function, the vapor chamber including a shielding frame having a second coupling structure, the cover adapted to demountably engage with the shielding frame and to dissipate heat from an electronic component surrounded by the shielding frame, the cover comprising:
a covering plate disposed over the shielding frame; and
a co-constructed plate disposed between the covering plate and the shielding frame, wherein the co-constructed plate has a first extending portion, the first extending portion surrounds the shielding frame, the first extending portion comprises a first coupling structure disposed on an inner surface thereof, and the second coupling structure demountably engages with the first coupling structure, and wherein the co-constructed plate is nested within a space defined by the covering plate.

3. The cover of claim 1, characterized in that the covering plate and the co-constructed plate are made of a same material.

4. The cover of claim 2, characterized in that the covering plate and the co-constructed plate are made of a same material.

5. The cover of claim 1, characterized in that the first coupling structure is integrally formed on the inner surface of the extending portion, and the second coupling structure is integrally formed on an outer surface of a sidewall of the shielding frame.

6. The cover of claim 1, characterized in that the shielding frame has a sidewall, a fetch region and a plurality of arms, wherein the arms extend vertically from the sidewall and connect to the fetch region.

7. The cover of claim 1, characterized in that an inner surface of the covering plate and an outer surface of the co-constructed plate are fixed to each other by a soldering layer.

8. The cover of claim 2, characterized in that an inner surface of the covering plate and an outer surface of the co-constructed plate are fixed to each other by a soldering layer.

9. The cover of claim 1, characterized in that one of the first coupling structure and the second coupling structure is a concave rail, and the other is a convex structure which matches the concave rail.

10. The cover of claim 1, characterized in that one of the first coupling structure and the second coupling structure is a hook, and the other is a slot or hole which matches the hook.

11. The cover of claim 2, wherein the co-constructed plate and the covering plate jointly define a room containing a capillary structure, a supporting structure, and a working fluid.

12. The cover of claim 2, characterized in that one of the first coupling structure and the second coupling structure is a concave rail, and the other is a convex structure which matches the concave rail.

13. The cover of claim 2, characterized in that one of the first coupling structure and the second coupling structure is a hook, and the other is a slot or hole which matches the hook.

14. The cover of claim 2, characterized in that the first coupling structure is integrally formed on the inner surface of the co-constructed plate, and the second coupling structure is integrally formed on an outer surface of a sidewall of the shielding frame.

15. The cover of claim 2, characterized in that the shielding frame has a sidewall, a fetch region and a plurality of arms, wherein the arms extend vertically from the sidewall and connect to the fetch region.

16. The cover of claim 1, wherein the co-constructed plate is soldered to an inner surface of the extending portion.

17. The cover of claim 2, wherein the covering plate comprises a second extending portion, and an outer surface of the first extending portion is soldered to an inner surface of the second extending portion.

* * * * *